United States Patent [19]

Orr et al.

[11] 4,425,514

[45] Jan. 10, 1984

[54] FIXED PULSE WIDTH, FAST RECOVERY ONE-SHOT PULSE GENERATOR

[75] Inventors: John R. Orr, Pennsauken; Jacob H. Hoover, Jr., Medford, both of N.J.

[73] Assignee: RCA Corporation, New York, N.Y.

[21] Appl. No.: 320,017

[22] Filed: Nov. 10, 1981

[51] Int. Cl.³ .................... H03K 3/033; H03K 3/86
[52] U.S. Cl. .................... 307/265; 307/273; 307/603; 328/58
[58] Field of Search ............ 307/273, 265, 603; 328/207, 58

[56] References Cited

U.S. PATENT DOCUMENTS

| | | | |
|---|---|---|---|
| 2,949,547 | 8/1960 | Zimmermann | 307/273 |
| 3,601,636 | 8/1971 | Marsh | 307/273 |
| 3,668,423 | 6/1972 | Couch | 307/273 |
| 3,761,743 | 9/1973 | Barber | 307/273 |
| 3,768,026 | 10/1973 | Pezzutti | 328/207 |
| 3,790,821 | 2/1974 | Adamson | 307/273 |
| 3,820,029 | 6/1974 | McKinley | 328/207 |
| 3,965,431 | 6/1976 | Johnson | 328/58 |
| 3,979,746 | 9/1976 | Jarrett | 307/273 |
| 4,105,980 | 8/1978 | Cowardin et al. | 307/273 |

*Primary Examiner*—John S. Heyman
*Attorney, Agent, or Firm*—Joseph S. Tripoli; Robert L. Troike; Christopher L. Maginniss

[57] ABSTRACT

A one-shot generator generates a fixed-width pulse in response to an input signal. The pulse is applied to a delay line and the leading edge of the signal emerging from that delay line generates a control signal pulse which terminates the fixed-width pulse and primes the one-shot for an immediate subsequent occurrence of the input signal to generate a second fixed-width pulse.

9 Claims, 4 Drawing Figures

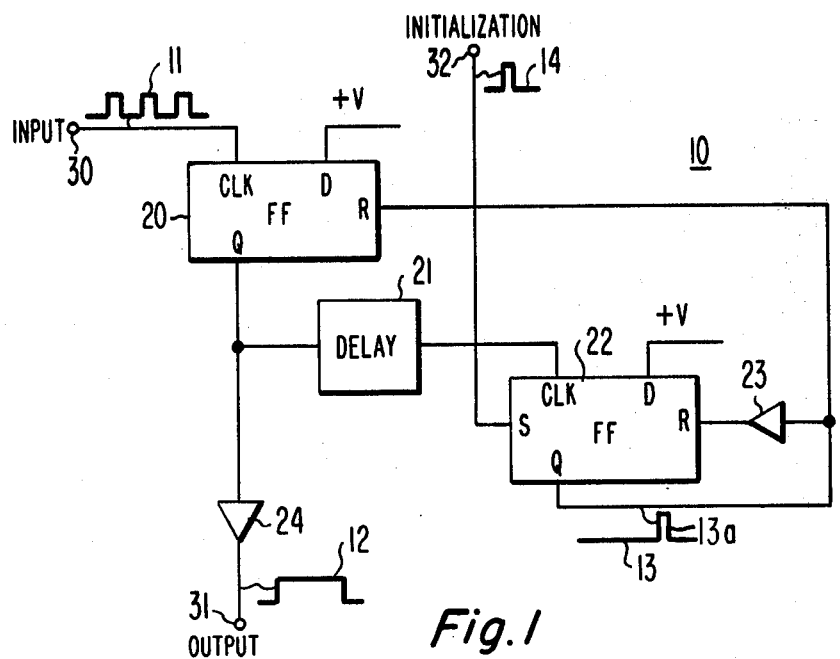
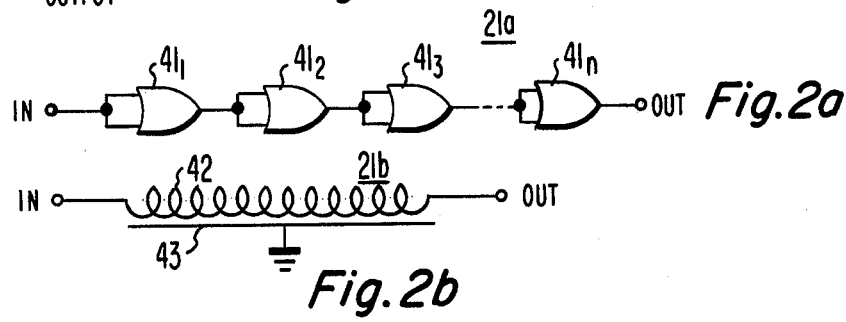
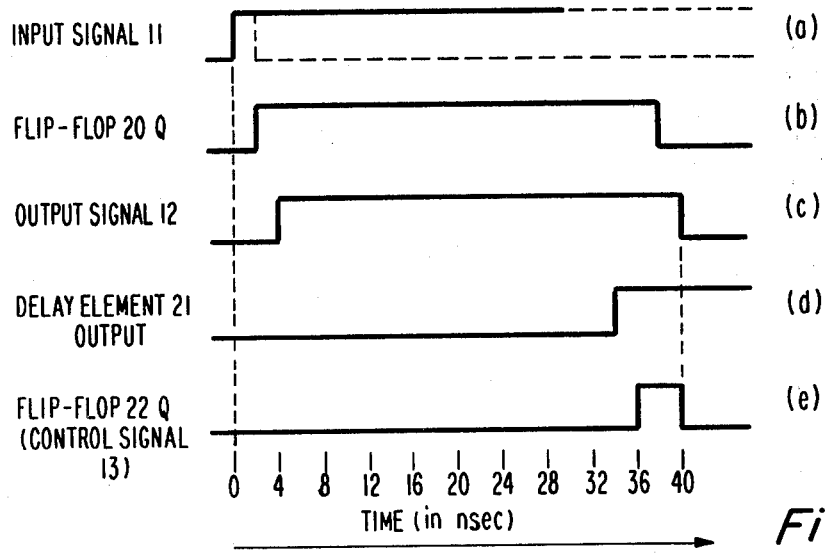

FIXED PULSE WIDTH, FAST RECOVERY ONE-SHOT PULSE GENERATOR

This invention relates to digital logic circuits and, more particularly, to a one-shot pulse generator having a fixed pulse width and extremely fast recovery time.

Many one-shot pulse generators are known in the art. The earlier one-shot generators used discrete components including resistors and capacitors (generally configured as integrators) as the timing elements. As the systems requirements grew, logic families with increased speed capability were developed, and the weaknesses of RC-based timing became more apparent. At present, the need for precise one-shot periods in high-speed logic systems has resulted in the adoption of propagation-type delay lines such as LC lumped constant delay lines, distributed constant delay lines (coaxial cables), and standard logic gate delay lines. These devices differ from the RC type, which depend on a capacitive charging time to provide the delay, in that they propagate the entire applied signal through the device. These newer types of delay elements are used almost exclusively in high-speed emitter-coupled logic (ECL) families where RC one-shot generators are not generally available.

One of the shortcomings of a typical one-shot generator employing a propagation-type delay line (and, to a lesser extent, an RC-based one-shot) inheres in the delayed propagation of the entire output pulse through the delay element. During the period of this propagation, referred to as the recovery time, no subsequent output pulses may be generated, if the output pulses are to be of a fixed width. U.S. Pat. No. 3,601,636, "Single-Shot Device," issued Aug. 24, 1971, to Marsh is cited to illustrate the recovery-time problem for a one-shot generator using an RC integrating network. In order to provide a fixed-width pulse in the Marsh patent, subsequent enabling pulses of the input signal must not occur during the discharge time of the capacitor. This problem is magnified for typical one-shot generators employing propagation-type delay lines, where the one-shot generators cannot be used to generate fixed-width pulses until the entire input signal clears the delay line. Even where the input signal and output pulse are gated with a clocking signal to provide precise pulse widths, as in U.S. Pat. No. 3,965,431, "Circuitry for Producing Pulses with Precise Predetermined Widths," issued June 22, 1976, to Johnson, the pulse width and recovery time are limited by the period of the clock.

In accordance with one embodiment of the present invention, an apparatus is disclosed which is responsive to an input signal for generating a signal pulse of predetermined width regardless of subsequent occurrences of the input signal during the signal pulse. The apparatus includes pulse generating means responsive to the input signal at one input thereof for initiating the signal pulse at an output thereof and responsive also to a control signal at a second terminal thereof for terminating the signal pulse. The apparatus further includes means coupled to the output of the pulse generating means for providing a delay of the signal pulse, the delay time being in fixed relation to the predetermined width of the signal pulse. Third means are provided for generating the control signal which is of short duration relative to the delay time. The control signal is coupled to the second terminal of the pulse generating means for terminating the signal pulse.

In the drawing:

FIG. 1 is a logic diagram of the preferred embodiment of the present invention;

FIG. 2a is a logic diagram of the delay element of the one-shot of FIG. 1 according to one embodiment;

FIG. 2b illustrates the delay element of the one-shot of FIG. 1 according to a second embodiment; and FIG. 3 is a timing diagram useful in understanding the circuit of FIG. 1.

Referring to FIG. 1 there is shown a one-shot pulse generator 10 which provides an output positive-level signal pulse 12 of fixed width at output terminal 31 in response to a positive-going transition of the input signal 11 applied at input terminal 30. One-shot generator 10 ignores all subsequent positive-going transitions of signal 11 at input terminal 30 which occur during the output signal pulse 12; i.e., output signal pulse 12 is always the same length regardless of the activity of input signal 11 following its initial positive-going transition. Furthermore, one-shot generator 10 is able to respond to positive-going transition pulses of input signal 11 which occur immediately following the falling edge of output signal pulse 12.

The digital logic elements of the present embodiment may be similar to those of the Emitter-Coupled Logic (ECL) III 1600 series sold by, for example, Motorola Semiconductor Products, Inc., Phoenix, Arizona, but this should not be construed as a limitation on the invention. ECL III logic is used in the example because it represents high-speed logic to which the present invention is particularly suited, and also because ECL III one-shot generators require propagation-type delay lines which, as the earlier discussion pointed out, present the more serious recovery time problem.

Referring to FIG. 1, input signal 11 is coupled from input terminal 30 to the clock (CLK) input of flip-flop 20 which may be, for example, type 1670 master-slave D-type flip-flop. Flip-flop 20 responds to a positive-going transition of the signal at its CLK input to transfer the signal at its data (D) input to its Q output. In the present embodiment, +V, representing a logic 1, is coupled to the D input of flip-flop 20, causing a logic 1 to be clocked to the Q output on every positive transition of input signal 11.

The signal at the Q output of flip-flop 20 is applied to the input of delay element 21 which provides at its output terminal a signal substantially duplicating the signal at its input terminal after a fixed delay. Delay element 21 of FIG. 1 may be, for example, the concatenation of OR logic gates $41_1$, $41_2$, $41_3$, ... $41_n$, comprising delay element 21a shown in FIG. 2a. Each gate $41_1$, $41_2$, $41_3$, ... $41_n$ provides a finite delay equal to the delay of signal propagation through it. The gates may be, for example, similar to type 1664 2-input OR gates, each of which provides a delay of approximately one nanosecond (nsec). The total delay through element 21a is the sum of the delays of each individual gate which, in the present example, is 32 nsec. Elements of compatable logic families having greater propagation delays, such as, for example, the ECL II and ECL 10,000 series, may be used for gates $41_1$, $41_2$, $41_3$, ... $41_n$, resulting in a saving of gates, but at a cost of delay time precision.

A second embodiment of the delay element 21 of FIG. 1 is the delay line 21b illustrated in FIG. 2b. Delay line 21b comprises distributed inductance 42 between the input (IN) and output (OUT) terminals and distributed capacitance 43 to ground. Delay line 21b is typically a coaxial cable; the depiction of FIG. 2 does not include the series resistance and shunt conductance inherent in such a coaxial cable. An advantage of using coaxial cable as delay element 21b is the precise measure of delay which may be obtained, as its propagation speed is approximately 1.4 nsec/ft.

Referring again to FIG. 1, the signal at the Q output of flip-flop 20 is also applied to buffer 24, which provides a nominal logic element delay to the signal which is then applied to output terminal 31. As will be seen in connection with the discussion of FIG. 3, the delay provided by buffer 24 ensures that flip-flop 20 is primed to receive a positive-going transition of input signal 11 the instant that signal pulse 12 at output terminal 31 terminates.

The delayed signal appearing at the output of delay element 21 is applied to the CLK input of flip-flop 22 which is of a type similar to flip-flop 20. As in flip-flop 20, the D input of flip-flop 22 is coupled to +V such that positive transitions of the signal at the CLK input of flip-flop 22 cause the signal at its Q output to be clocked to the logic 1 state. The control signal 13 at the Q output of flip-flop 22 is coupled, via buffer 23, to the asynchronous reset (R) input terminal of flip-flop 22. A logic 1 signal at the R input causes signal 13 at the Q output to assume a logic 0 state, regardless of the nature of the signal at the CLK input. In addition, control signal 13 at the Q output of flip-flop 22 is coupled to the R input of flip-flop 20.

Like buffer 24, buffer 23 serves the function of providing a logic element delay in the signal path. Buffer 23 serves to stretch the pulse of control signal 13 (which tends to be self-extinguishing at logic element propagation speed) to ensure that an adequate resetting pulse is provided to flip-flop 20.

The asynchronous set (S) input terminal of flip-flop 22 is coupled to terminal 32 to which an initializing signal 14 may be applied. By the very nature of its configuration within the circuit, flip-flop 22 must reside in its reset state. However, in the absence of any outside influence, flip-flop 20 may exist in either a set or reset state following, for example, a power turn-on. A short positive pulse of initializing signal 14 will cause a corresponding short positive pulse of signal 13 at the Q output terminal of flip-flop 22, thereby forcing flip-flop 20 to its reset state.

Buffers 23 and 24 provide merely a short delaying function, similar to, but shorter than, the delay through delay element 21. Because the buffer delays must be approximately the same as the delays through flip-flops 20 and 22, possible configurations for buffers 23 and 24 may be series combinations of, for example two type 1662 2-input NOR gates or two type 1664 2-input OR gates, each gate having its two inputs connected as one. Either combination provides the required delay, without otherwise affecting the signal through it.

FIG. 3 illustrates a series of pulses, related on the time axis, which are useful in explaining, by way of example, the operation of one-shot generator 10. For the example, typical logic element delays of two nsec for ECL III 1600 series logic will be employed. This two nsec delay applies to the propagation through buffers 23 and 24 as well as the CLK-to-Q and R-to-Q delays in flip-flops 20 and 22.

As seen in waveform (a) of the timing diagram of FIG. 3, the level of signal 11 at input terminal 30 goes from a logic 0 to a logic 1 at time t=0. By the nature of the CLK input of flip-flop 20 and of its configuration within one-shot generator 10, there is no different effect on a signal pulse 12 at output terminal 31 if input signal 11 returns immediately to a logic 0 state, if it remains at a logic 1 state beyond the period of output pulse 12, or if it pulses between logic 1 and logic 0.

Flip-flop 20, initially in a reset state, sets in response to the positive-going transition at its CLK input and the logic 1 at its D input, causing a positive transition of the signal at its Q output after a delay of two nsec (see waveform (b) of FIG. 3). After another two nsec delay through buffer 24, at time t=4, the signal level at output terminal 31 makes a logic 0 to logic 1 transition (see waveform (c) of FIG. 3). This is the initiation of pulse 12.

The positive-going transition of the signal at the Q output of flip-flop 20 propagates through delay element 21 and, after a delay of 32 nsec, by way of example, the leading edge appears at the output terminal of delay element 21 (see waveform (d) of FIG. 3). This signal goes to a logic 1 state at time t=34 (32 nsec after the positive-going transition on the Q output terminal of flip-flop 20). The delay element 21 output signal is applied to the CLK input of flip-flop 22. As flip-flop 22 was initially reset, the CLK signal and the logic 1 signal at the D input cause flip-flop 22 to set after a propagation delay of two nsec, resulting in a positive-going transition of the control signal 13 at its Q output terminal (see waveform (e) of FIG. 3). Control signal 13 propagates through buffer 23 and appears at the R input of flip-flop 22, causing flip-flop 22 to be reset and resulting in a high-to-low transition 13a on control signal 13. The pulse duration of control signal 13 is four nsec—two nsec propagation delay through buffer 23 and two nsec delay through flip-flop 22 (see waveform (e) of FIG. 3). Control signal 13 is also applied to the R input of flip-flop 20 which resets, causing the signal at its Q output terminal to go to a logic 0 state after a two nsec delay (see waveform (b) of FIG. 3). The delay in buffer 24 results in a negative-going transition of signal 12 two nsec later at time t=40 (see waveform (c) of FIG. 3). This is the termination of output pulse 12. It is thus seen that the 36 nsec logic 1 level of output signal pulse 12 results from the 32 nsec delay of element 21 and fixed gate and flip-flop delays which, in the example, total four nsec.

As a result of an examination of the one-shot generator 10 depicted in FIG. 1, and the timing diagram of FIG. 3, the following features of this circuit become evident:

(1) The high level of output signal pulse 12 is of a fixed length directly related to the delay of delay element 21;

(2) The fixed length of the output signal pulse 12 is unaffected by the logic state of input signal 11, during or following the delay period; and (3) One-shot generator 10 is primed to detect and respond to a new positive-going transition of input signal 11 immediately following the negative-going transition of output signal pulse 12. This third feature is revealed in waveforms (c) and (e) of FIG. 3, which indicate that, at time t=40, control signal 13 forcing a reset of flip-flop 20 goes to a logic 0 state at the same time as the falling edge of output signal pulse 12, thereby permitting an immediately-following positive-going transition of input signal 11 to set flip-flop 20 and initiate a new pulse on output signal 12.

The present invention finds application in circuits employing one-shot generators presently known in the art; however, its precisely-fixed pulse width and immediate recovery time make it additionally suited for use as a pulse eliminator or frequency divider involving signals whose frequency approaches the cut-off frequency of the logic elements themselves. Although the invention is presently embodied in ECL III 1600 series logic elements, the principles taught herein are equally applicable to other logic families.

What is claimed is:

1. An apparatus responsive to an input signal for generating a signal pulse of a predetermined width regardless of subsequent occurrences of said input signal during said signal pulse, said apparatus comprising:

pulse generating means responsive to said input signal at one input thereof for initiating said signal pulse at an output thereof and a control signal at a second terminal thereof for terminating said signal pulse, said signal pulse being initiated substantially coinstantaneously with said input signal;

said pulse generating means including means having a short duration time constant so that said apparatus may be responsive to a subsequent occurrence of said input signal immediately upon the termination of said signal pulse for generating a subsequent signal pulse of said predetermined width;

means coupled to the output of said pulse generating means for delaying said signal pulse, said delay time being in fixed relation to said predetermined width of said signal pulse; and means for generating said control signal in response to said delayed signal pulse, said control signal being a pulse of short duration equal to said short duration time constant, said control signal being coupled to said second terminal of said pulse generating means for terminating said signal pulse.

2. The apparatus according to claim 1 wherein said pulse generating means includes a D-type flip-flop having a clock input terminal adapted to receive said input signal.

3. The apparatus according to claim 1 wherein said control signal generating means includes a D-type flip-flop having a clock input terminal and having an asynchronous reset terminal, said flip-flop having its clock input terminal coupled to said delayed signal pulse to initiate said control signal pulse in response to said delayed signal pulse, and wherein said control signal is applied to said asynchronous reset input terminal of said flip-flop to thereby cause the termination of said control signal pulse.

4. The apparatus of claim 3 further including means for extending said control signal pulse applied to said asynchronous reset input terminal of said flip-flop.

5. The apparatus according to claim 4 wherein said pulse extending means includes a buffer comprising a standard logic gate.

6. The apparatus according to claim 1 wherein said signal pulse delaying means includes a plurality of standard logic gates interconnected in series configuration.

7. The apparatus according to claim 1 wherein said signal pulse delaying means includes a distributed constant delay line.

8. The apparatus according to claim 7 wherein said distributed constant delay line includes a length of coaxial cable.

9. The apparatus of claim 1 which provides a signal pulse of predetermined width, said predetermined width being equal to the sum of said delay time and propagation delay times through elements of said apparatus.

* * * * *